(12) United States Patent
Hung

(10) Patent No.: US 10,656,875 B2
(45) Date of Patent: May 19, 2020

(54) METHOD FOR RE-READING PAGE DATA

(71) Applicant: SILICON MOTION, INC., Jhubei, Hsinchu County (TW)

(72) Inventor: Ying-Chun Hung, Jhubei (TW)

(73) Assignee: Silicon Motion, Inc., Jhubei (TW)

( * ) Notice: Subject to any disclaimer, the term of this patent is extended or adjusted under 35 U.S.C. 154(b) by 33 days.

(21) Appl. No.: 16/184,179

(22) Filed: Nov. 8, 2018

(65) Prior Publication Data
US 2019/0354314 A1 Nov. 21, 2019

(30) Foreign Application Priority Data

May 17, 2018 (TW) .............................. 107116796 A

(51) Int. Cl.
*G06F 3/06* (2006.01)
*G06F 11/10* (2006.01)
*G11C 29/52* (2006.01)

(52) U.S. Cl.
CPC .......... *G06F 3/0659* (2013.01); *G06F 3/0619* (2013.01); *G06F 3/0679* (2013.01); *G06F 11/1068* (2013.01); *G11C 29/52* (2013.01)

(58) Field of Classification Search
CPC .... G06F 3/0659; G06F 3/0679; G06F 3/0619; G06F 3/0628; G06F 11/1068; G06F 11/10; G06F 11/16; G06F 11/1012; G11C 16/3418; G11C 29/04; G11C 29/52
See application file for complete search history.

(56) References Cited

U.S. PATENT DOCUMENTS

| 10,509,583 B1* | 12/2019 | Hsiao | G06F 3/0679 |
| 2013/0080858 A1* | 3/2013 | Lee | G11C 16/26 |
| | | | 714/773 |
| 2015/0186210 A1* | 7/2015 | Tsai | G06F 11/1068 |
| | | | 714/764 |
| 2016/0306593 A1* | 10/2016 | Xie | G06F 3/0659 |

* cited by examiner

*Primary Examiner* — Shelly A Chase

(57) ABSTRACT

A method for re-reading page data is provided. The method for re-reading page data classifies each of the retry tables into one of a plurality of retry types, and when starting the re-reading procedure, the method will firstly select a retry type based on the environmental parameters related to reading the target page, and select a retry table from the selected retry type and re-read the data of the target page according to the read parameters of the retry table, thereby reducing a number of times of repetitively reading the target page and preventing read disturbance caused by frequent reading.

9 Claims, 8 Drawing Sheets

| Index value | Retry table | Retry type |
|---|---|---|
| 0 | T(0) | First retry type |
| 1 | T(1) | |
| 2 | T(2) | |
| 3 | T(3) | |
| 4 | T(4) | |
| 5 | T(5) | |
| 6 | T(6) | |
| 7 | T(7) | |
| 8 | T(8) | |
| 9 | T(9) | |
| 10 | T(10) | Second retry type |
| 11 | T(11) | |
| 12 | T(12) | |
| 13 | T(13) | |
| 14 | T(14) | |
| 15 | T(15) | |
| 16 | T(16) | |
| 17 | T(17) | |
| 18 | T(18) | |
| 19 | T(19) | |
| 20 | T(20) | Third retry type |
| 21 | T(21) | |
| 22 | T(22) | |
| 23 | T(23) | |
| 24 | T(24) | |

| Index value | Retry table | Retry type |
|---|---|---|
| 25 | T(25) | Third retry type |
| 26 | T(26) | |
| 27 | T(27) | |
| 28 | T(28) | |
| 29 | T(29) | |
| 30 | T(30) | Fourth retry type |
| 31 | T(31) | |
| 32 | T(32) | |
| 33 | T(33) | |
| 34 | T(34) | |
| 35 | T(35) | |
| 36 | T(36) | |
| 37 | T(37) | |
| 38 | T(38) | |
| 39 | T(39) | |
| 40 | T(40) | Fifth retry type |
| 41 | T(41) | |
| 42 | T(42) | |
| 43 | T(43) | |
| 44 | T(44) | |
| 45 | T(45) | |
| 46 | T(46) | |
| 47 | T(47) | |
| 48 | T(48) | |
| 49 | T(49) | |

FIG. 5A

| Index value | Retry table | Retry type |
|---|---|---|
| 0 | T(0) | First retry type |
| 1 | T(1) | |
| 2 | T(2) | |
| 3 | T(3) | |
| 4 | T(4) | |
| 5 | T(5) | |
| 6 | T(6) | |
| 7 | T(7) | |
| 8 | T(8) | |
| 9 | T(9) | |
| 11 | T(10) | Second retry type |
| 12 | T(11) | |
| 13 | T(12) | |
| 14 | T(13) | |
| 15 | T(14) | |
| 10 | T(15) | |
| 16 | T(16) | |
| 17 | T(17) | |
| 18 | T(18) | |
| 19 | T(19) | |
| 20 | T(20) | Third retry type |
| 21 | T(21) | |
| 22 | T(22) | |
| 23 | T(23) | |
| 24 | T(24) | |

| Index value | Retry table | Retry type |
|---|---|---|
| 25 | T(25) | Third retry type |
| 26 | T(26) | |
| 27 | T(27) | |
| 28 | T(28) | |
| 29 | T(29) | |
| 30 | T(30) | Fourth retry type |
| 31 | T(31) | |
| 32 | T(32) | |
| 33 | T(33) | |
| 34 | T(34) | |
| 35 | T(35) | |
| 36 | T(36) | |
| 37 | T(37) | |
| 38 | T(38) | |
| 39 | T(39) | |
| 40 | T(40) | Fifth retry type |
| 41 | T(41) | |
| 42 | T(42) | |
| 43 | T(43) | |
| 44 | T(44) | |
| 45 | T(45) | |
| 46 | T(46) | |
| 47 | T(47) | |
| 48 | T(48) | |
| 49 | T(49) | |

FIG. 5B

| Index value | Retry table | Retry type | Index value | Retry table | Retry type |
|---|---|---|---|---|---|
| 0 | T(0) | First retry type | 25 | T(25) | Third retry type |
| 1 | T(1) | | 26 | T(26) | |
| 2 | T(2) | | 27 | T(27) | |
| 3 | T(3) | | 28 | T(28) | |
| 4 | T(4) | | 29 | T(29) | |
| 5 | T(5) | | 30 | T(30) | Fourth retry type |
| 6 | T(6) | | 31 | T(31) | |
| 7 | T(7) | | 32 | T(32) | |
| 8 | T(8) | | 33 | T(33) | |
| 9 | T(9) | | 34 | T(34) | |
| 12 | T(10) | Second retry type | 35 | T(35) | |
| 13 | T(11) | | 36 | T(36) | |
| 14 | T(12) | | 37 | T(37) | |
| 15 | T(13) | | 38 | T(38) | |
| 16 | T(14) | | 39 | T(39) | |
| 11 | T(15) | | 40 | T(40) | Fifth retry type |
| 10 | T(16) | | 41 | T(41) | |
| 17 | T(17) | | 42 | T(42) | |
| 18 | T(18) | | 43 | T(43) | |
| 19 | T(19) | | 44 | T(44) | |
| 20 | T(20) | Third retry type | 45 | T(45) | |
| 21 | T(21) | | 46 | T(46) | |
| 22 | T(22) | | 47 | T(47) | |
| 23 | T(23) | | 48 | T(48) | |
| 24 | T(24) | | 49 | T(49) | |

FIG. 5C

| Index value | Retry table | Retry type |
|---|---|---|
| 0 | T(0) | First retry type |
| 1 | T(1) | |
| 2 | T(2) | |
| 3 | T(3) | |
| 4 | T(4) | |
| 5 | T(5) | |
| 6 | T(6) | |
| 7 | T(7) | |
| 8 | T(8) | |
| 9 | T(9) | |
| 12 | T(10) | Second retry type |
| 13 | T(11) | |
| 14 | T(12) | |
| 15 | T(13) | |
| 16 | T(14) | |
| 11 | T(15) | |
| 10 | T(16) | |
| 17 | T(17) | |
| 18 | T(18) | |
| 19 | T(19) | |
| 20 | T(20) | Third retry type |
| 21 | T(21) | |
| 22 | T(22) | |
| 23 | T(23) | |
| 24 | T(24) | |

| Index value | Retry table | Retry type |
|---|---|---|
| 25 | T(25) | Third retry type |
| 26 | T(26) | |
| 27 | T(27) | |
| 28 | T(28) | |
| 29 | T(29) | |
| 31 | T(30) | Fourth retry type |
| 32 | T(31) | |
| 30 | T(32) | |
| 33 | T(33) | |
| 34 | T(34) | |
| 35 | T(35) | |
| 36 | T(36) | |
| 37 | T(37) | |
| 38 | T(38) | |
| 39 | T(39) | |
| 40 | T(40) | Fifth retry type |
| 41 | T(41) | |
| 42 | T(42) | |
| 43 | T(43) | |
| 44 | T(44) | |
| 45 | T(45) | |
| 46 | T(46) | |
| 47 | T(47) | |
| 48 | T(48) | |
| 49 | T(49) | |

FIG. 5D

METHOD FOR RE-READING PAGE DATA

FIELD OF THE INVENTION

The present invention relates to a method for re-reading page data and more particularly to a method that can select from a plurality of retry tables of a suitable retry type to re-read a page according to the environmental parameters related to reading the page.

BACKGROUND OF THE INVENTION

Non-volatile memory (NVM) is a data storage medium that has the capabilities to maintain information without additional electric power, read data fast, and resist shock, and therefore is widely used in memory cards, solid-state drives (SSD), and portable multimedia devices. In general, a non-volatile memory, such as a flash memory storage array, includes a plurality of blocks, and each of the blocks includes a plurality of pages. A page is usually the smallest unit of programming. In other words, the page is the smallest unit when writing or reading data. When reading the data of a certain page, a data storage device reads the data of the page according to preset read parameters and decodes the data of the read page.

However, even if the above decoding is capable of error correction, its correction capability still has an upper limit. Therefore, once it is found that the data of the read page cannot be error-corrected effectively by the decoding; that is, the decoding result exceeds a certain level of errors, the data storage device re-reads the data of the page according to each of a plurality of retry tables sequentially by using different read parameters, until the data of the page can be read without an occurrence of an uncorrectable error. As a result, the more the retry tables, the more time the data storage device may take to find a suitable retry table, so that the times of reading the page is relatively increased. Thus, read disturbance may easily occur.

SUMMARY OF THE INVENTION

An object of the present invention is to provide a method for re-reading a page that can select from a plurality of retry tables of a suitable retry type according to the environmental parameters related to reading the page, thereby increasing the retry hit rates of the retry tables, and at the same time preventing read disturbance caused by frequent reading.

To achieve the above object, an embodiment of the present invention provides a method for re-reading page data that can be executed in a data storage device. The data storage device comprises a non-volatile memory and a controller. The non-volatile memory comprises a plurality of blocks and each of the blocks comprises a plurality of pages. The method for re-reading page data comprises the following steps. Firstly, reading the data stored on a target page of a target block by the controller, wherein the target block is one of the blocks, and the target page is correspondingly one of the pages of the target block. Secondly, determining by the controller whether the data stored on the target page can be obtained. If the data stored on the target page cannot be obtained, selecting one of a plurality of retry types by the controller according to at least one environmental parameter, and selecting a retry table from a plurality of retry tables of the selected retry type, wherein each of the retry tables further comprises an index value and records at least one read parameter. Then, re-reading the data stored on the target page by the controller using the read parameter of the selected retry table, and returning to the step of determining by the controller whether the data stored on the target page can be obtained.

The structural features and the technical means adopted by the present invention to achieve the above and other objects can be best understood by referring to the following detailed description of the preferred embodiments and the accompanying drawings. However, the detailed description and the accompanying drawings are only used to explain and illustrate the present invention rather than as limitative of the appended claims of the present invention.

BRIEF DESCRIPTION OF THE DRAWINGS

The present invention will become more readily apparent to those ordinarily skilled in the art after reviewing the following detailed description and accompanying drawings, in which:

FIG. 5A is a schematic diagram of the retry tables in the method for re-reading page data in FIG. 4 according to a preferred embodiment;

FIG. 5B is a schematic diagram of the retry tables in the method for re-reading page data in FIG. 4 according to another preferred embodiment;

FIG. 5C is a schematic diagram of the retry tables in the method for re-reading page data in FIG. 4 according to another preferred embodiment; and FIG. 5D is a schematic diagram of a retry table in the method for re-reading page data in FIG. 4 according to another preferred embodiment.

DETAILED DESCRIPTION OF PREFERRED EMBODIMENTS

Hereinafter, the present invention will be described in detail with drawings illustrating various embodiments of the present invention. However, the concept of the present invention may be embodied in many different forms and should not be construed as limitative of the exemplary embodiments set forth herein.

Figure 1:
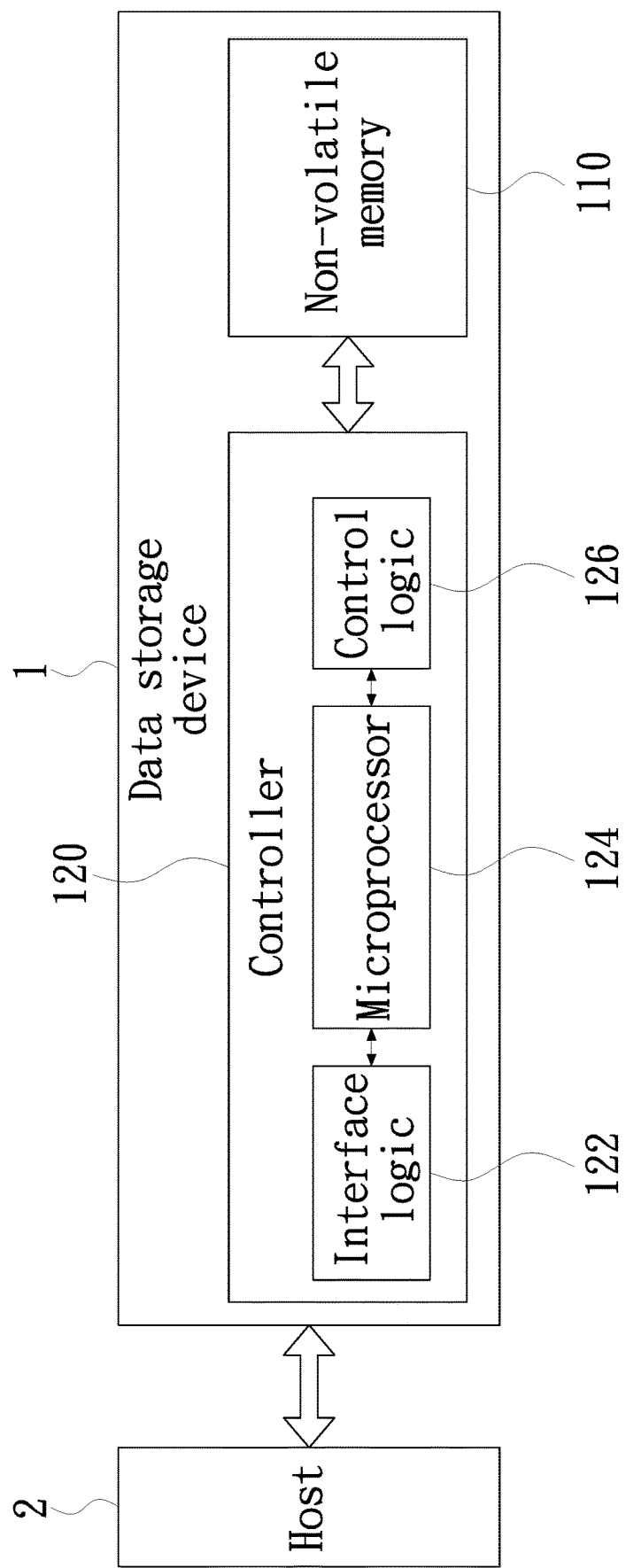
FIG. 1 is a functional block diagram of a data storage device according to an embodiment of the present invention.

Firstly, please refer to FIG. 1. FIG. 1 is a functional block diagram of a data storage device according to an embodiment of the present invention. The data storage device 1 comprises a non-volatile memory 110 and a controller 120. Wherein, the controller 120 is electrically coupled to the non-volatile memory 110 and used to control the data access of the non-volatile memory 110. In this embodiment, the non-volatile memory 110 can be implemented with, for example, a flash memory, but the invention is not limited thereto. In addition, it should be understood that the data storage device 1 is usually used together with a host 2, and writes data into the non-volatile memory 110 or reads data from the non-volatile memory 110 according to a write/read command issued by the host 2. Therefore, in this embodiment, the controller 120 can be, for example, a memory controller, and it mainly comprises an interface logic 122, a microprocessor 124, and a control logic 126, but the invention is not limited thereto. The microprocessor 124 is electrically coupled to the interface logic 122 and the control logic 126, and used to receive write/read commands issued by the host 2 through the interface logic 122, and to access the data in the non-volatile memory 110 through the control logic 126.

Figure 2:
FIG. 2 is a schematic diagram of a non-volatile memory in the data storage device of FIG. 1.

Then, please also refer to FIG. 2, which is a schematic diagram of a non-volatile memory in the data storage device of FIG. 1. The non-volatile memory 110 mainly comprises a plurality of blocks, for example, a block B0 to a block BZ, and each of the blocks further comprises a plurality of pages, for example, a page P0 to a page PN. In this embodiment, the block is the minimum unit for erasing and writing data, and the page is the minimum unit for writing or reading data, but the invention is not limited thereto. It should be explained that, the Z and N described above can be, for example, random positive integers, but the present invention does not limit the specific implementation of the numerical values. Those having ordinary knowledge in the technical field should be able to make related designs based on actual needs or applications.

Furthermore, any one of the blocks, such as the block B0, can be a single-level cell (SLC), a multi-level cell (MLC), a triple-level cell (TLC) or a quad-level cell (QLC) block, and each of the above cells can store 1, 2, 3, or 4 bits of data, respectively. Or alternatively, the block B0 can also be classified into a single-level cell mode or a preset mode according to different operation modes. Wherein, in the preset mode, the block B0 can provide the largest data storage capacity, and in the single-level cell mode, the block B0 can provide the best data access capability.

Figure 3A:
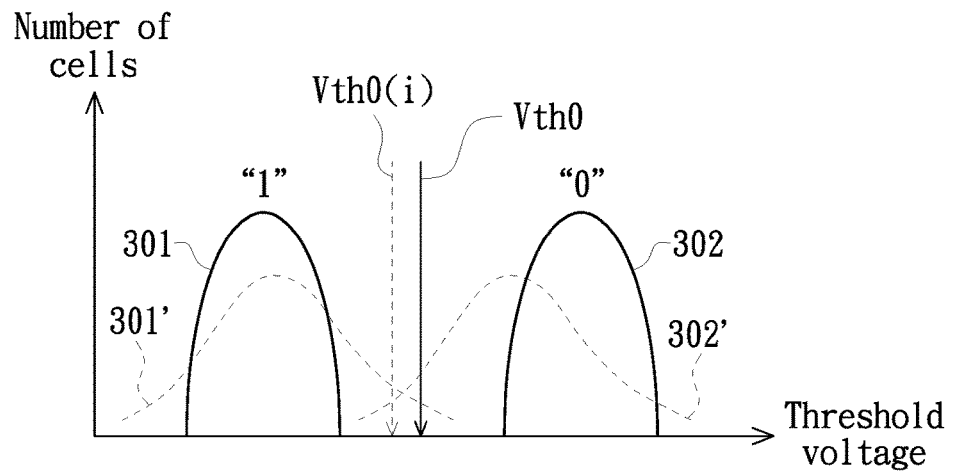
FIG. 3A is a schematic diagram of the distribution of the threshold voltage of the data storage device of FIG. 1 operating in a single-level cell mode.

Assuming that the block B0 is a single-level cell block or operates in a single-level cell mode, in the schematic diagram of its distribution of the threshold voltage, information states 301 and 302 correspond to bit "1" and bit "0", respectively, as shown in FIG. 3A. Therefore, when data is to be read from any one of the pages of the block B0, for example, the page P0, an internal circuit of the controller 120 or the block B0 needs to provide a read voltage Vth0 to read the bit value stored in the cell. If the read voltage Vth0 is provided and the cell is conducted, the information state 301 is determined, which means that the cell stores the bit "1"; contrarily, if the read voltage Vth0 is provided and the cell is not conducted, the information state 302 is determined, which means that the cell stores the bit "0".

Figure 3B:
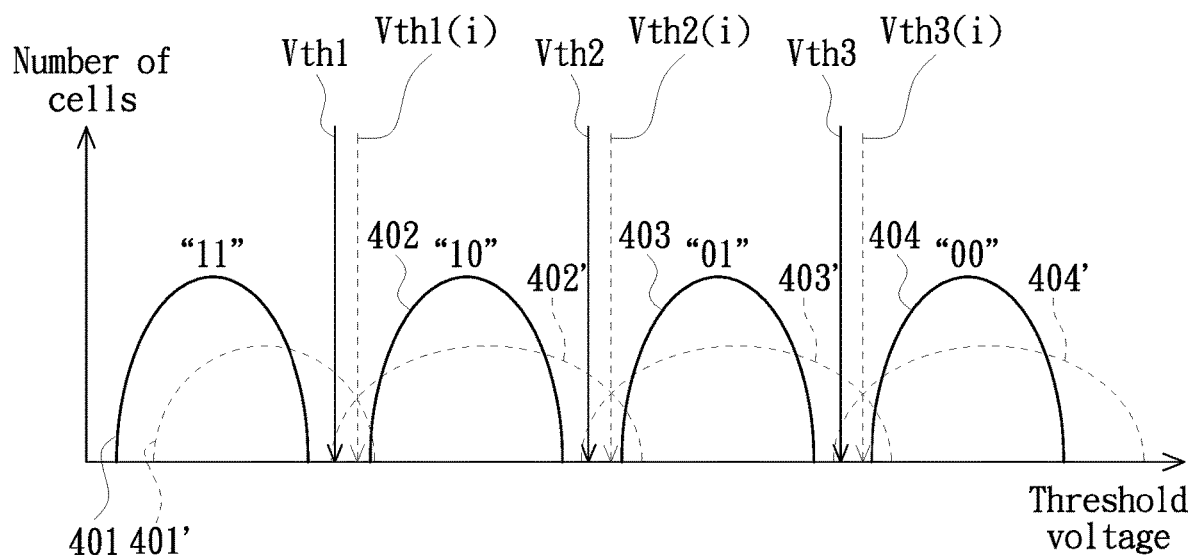
FIG. 3B is a schematic diagram of the distribution of the threshold voltage of the data storage device of FIG. 1 operating in a multi-level cell mode.

Similarly, assuming that the block B0 is a multi-level cell block, in the schematic diagram of its distribution of the threshold voltage, information states 401, 402, 403, and 404 correspond to bit "11", bit "10", bit "01" and bit "00", respectively, as shown in FIG. 3B. Therefore, when data is to be read from any one of the pages of the block B0, for example, the page P0, the internal circuit of the controller 120 or the block B0 needs to provide read voltages Vth1 to Vth3 to identify the bit value stored in the cells is "11", "10", "01" or "00". It should be explained that in other embodiments, the block B0 can also be a triple-level cell or a quad-level cell block, and at this time, the internal circuit of the controller 120 or the block B0 needs to provide more types of read voltages to identify the bit values stored in the cells. In summary, the schematic diagrams of FIGS. 3A and 3B are only examples here, and they are not used to limit the present invention. In addition, because the operating principles of providing the read voltage to identify the bit value stored in the cell is known to those having ordinary knowledge in the technical field, the details regarding the provision of the read voltage will not be further described here.

However, due to certain factors, such as standing data, cell loss, and high-low temperature interference, etc., the distribution of the threshold voltage may be offset, i.e. the information states 301 to 302 and the information states 401 to 404 are respectively offset to information state 301' to 302' and information states 401' to 404'. Using the read voltage Vth0 or the read voltages Vth1 to Vth3 after the offset may not be able to correctly identify the bit values stored in the cells. As described in the foregoing content, at this time, the controller 120 performs decoding to attempt to correct the data errors of the read page. Once it is found that the data errors of the read page cannot be effectively corrected, the controller 120 starts a re-reading procedure, that is, re-reads the data of the page according to each of a plurality of retry tables sequentially by using different read parameters, until the data errors of the read page can be corrected. Therefore, in this embodiment, different read parameters can be, for example, different read voltages, but the present invention is not limited thereto. Because in other embodiments, different read parameters can also, for example, refer to different error correction codes (ECC) or different error correction methods. Those having ordinary knowledge in the technical field should be able to make related designs based on actual needs or applications.

Assuming in a condition where the data storage device 1 of this embodiment comprises 50 of the retry tables built therein, for example, a retry table T(0) to a retry table T(49), it means that each of the retry tables T(0) to T(49) comprises the different read voltages Vth0 to Vth3. In the conventional method, the controller 120 first uses the read voltage Vth0(0) or the read voltages Vth1(0)-Vth3(0) of the retry table T(0) to re-read the data of the page. If the data errors of the read page still cannot be corrected effectively by using the read voltage Vth0(0) or the read voltages Vth1(0) to Vth3(0) of the retry table T(0), the controller 120 will continue to use the read voltage Vth0(1) or the read voltages Vth1(1) to Vth3(1) of the retry table T(1) to re-read the data of the page, and so on, until the data of the page can be read by using the read voltage Vth0($i$) or the read voltages Vth1($i$) to Vth3($i$) of the retry table T($i$) without an occurrence of an uncorrectable error. In other words, because the conventional method can only re-read based on the predetermined sequence of the retry tables T(0) to T(49); in this condition, if the more the number of the retry tables, the more time the controller 120 may take to read (correct) the data of the page correctly; that is, to find the suitable retry table T($i$). It should be understood that in this embodiment, i is any integer from 0 to 49, but the present invention is not limited thereto.

In order to solve the above problem, the present invention classifies each of the retry tables T(0)-T(49) into one of a plurality of retry types, and when starting the re-reading procedure, the controller 120 will firstly select a retry type based on the environmental parameters, and select a retry table from the selected retry type, and re-read the data of the page according to the read parameters of the retry table, thereby increasing the retry hit rates of the retry tables T(0)-T(49). For example, assuming that the environmental parameter is a temperature value, the retry tables T(0)-T(09) and the retry tables T(10)-T(19) respectively record the read parameters used for reading the pages under low temperatures (e.g. less than 15 degrees) and high temperatures (e.g. higher than 45 degrees) environments. Wherein, the temperature value can be provided by a temperature sensor (not shown) of the data storage device 1 or by a host, but the present invention is not limited thereto. In addition, assuming that the environmental parameter is a programming time, the retry tables T(20)-T(29) record the read parameters used for reading the old data of the pages (e.g. the time when the page data was programmed or the closed time of the block B0 has exceeded 24 hours). Furthermore, assuming that the environmental parameter is a program/erase count, the retry tables T(30)-T(39) record the read parameters used by the pages of high program/erase count (e.g. program/erase count is greater than 1,000). Finally, assuming that the environmental parameter is a read count, the retry tables T(40)-T(49) record the read parameters used by the pages of highly frequent read (e.g. read count is greater than 10,000).

In general, when programming the data of the page, the controller 120 writes parameters such as a timestamp indicating the programming time and a current temperature to a spare area of the page, and finally, the earliest timestamp, the highest and lowest temperature values, and a timestamp indicating the current time are recorded in the end of block information (EOB Info) of the block B0, and the EOB info is normally recorded on the last page of the block B0. Therefore, it can be known from the above content that five retry types can be defined in this embodiment, and the above-mentioned retry tables T(0)-T(09), retry tables T(10)-T(19), retry tables T(20)-T(29), retry tables T(30)-T(39), and retry tables T(40)-T(49) are respectively classified by the controller 120 into a first, a second, a third, a fourth, and a fifth retry type in the five retry types as shown in FIG. 5A.

Figure 4:
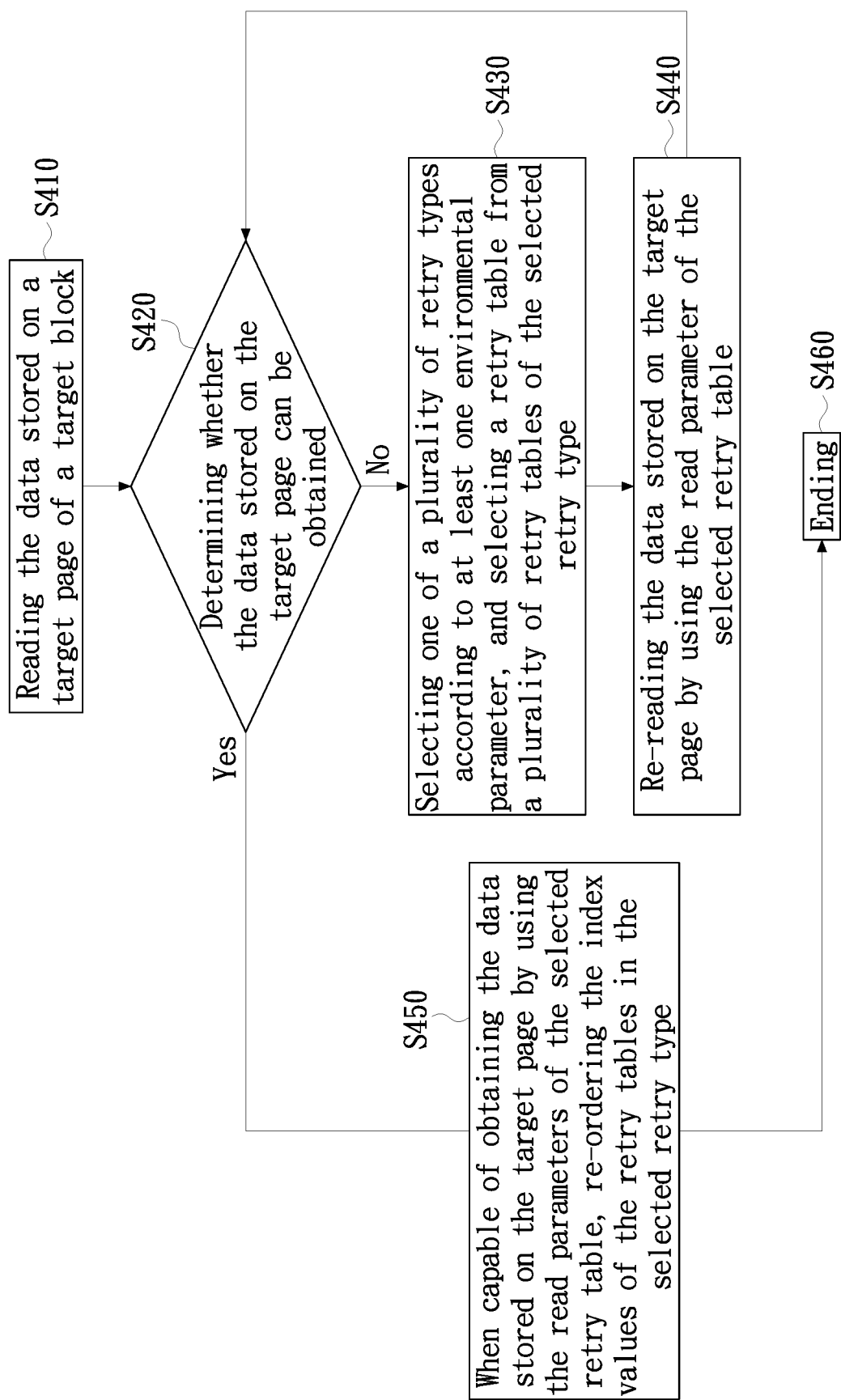
FIG. 4 is a flowchart of a method for re-reading page data according to an embodiment of the present invention.

It should be explained that the specific implementation manners of classifying each of the retry tables T(0)-T(49) into one of the retry types are only examples here, and are not used to limit the present invention. In addition, in this embodiment, each of the retry tables T(0)-T(49) can further comprise an index value, that is, a priority value, and the smaller the index value, the higher the priority order. However, the invention is not limited thereto. In summary, the present invention does not limit the specific implementation of the index values. Those having ordinary skill in the technical field should be able to make related designs based on actual needs or applications. Then, please refer to FIG. 4. FIG. 4 is a flowchart of a method for re-reading page data according to an embodiment of the present invention. Wherein, it should be understood that the method for re-reading page data of FIG. 4 can be executed in the data storage device 1 of FIG. 1, but the present invention does not limit that the method of re-reading page data of FIG. 4 can only be executed in the data storage device of FIG. 1.

As shown in FIG. 4, firstly, in step S410, reading the data stored on a target page of a target block by the controller 120, wherein the target block is one of the blocks from the block B0 to the block BZ, and the target page is correspondingly one of the pages from the page P0 to the page PN of the target block. It should be understood that the target block or the target page is specified by a data read command, or determined according to the data read command and a logical address to physical address mapping table, and the data read command is sent from the host 2 to the data storage device 1. The logical address to physical address mapping table is stored in the data storage device 1, and temporarily stored in a volatile memory (not shown) of the data storage device 1 or the host 2.

Secondly, in step S420, determining by the controller 120 whether the data stored on the target page can be obtained. If yes, executing step S460 to end the method for re-reading page data in this embodiment; if no, executing step S430. It should be understood that after reading (or re-reading) the data stored on the target page, the controller 120 will automatically correct the data errors of the read target page.

For example, the controller 120 corrects the data errors of the read target page by using the error correction code. If the number of bits of the data errors exceeds an upper limit the error correction code can correct, for example, 120 bits/1024 bytes, the controller 120 cannot use the error correction code to correct the data errors of the read target page. In other words, the controller 120 cannot obtain the data stored on the target page.

Next, in the step S430, selecting one of a plurality of retry types according to at least one environmental parameter, and selecting a retry table from a plurality of retry tables of the selected retry type, wherein each of the retry tables records at least one read parameter, and the controller 120 preferably selects one of the retry tables according to the index value. In addition, a starting value of the index value can be different depending on the retry type, for example, a starting value of a first retry type is 0, a starting value of a second retry type is 10, and so on, but the present invention is not limited thereto. Assuming that the environmental parameters are respectively the current temperature value of 65 degrees, the programming time of 5 hours from the current time, the program/erase count of 100, and the read count of 2000. Therefore, the controller 120 can select the second retry type according to the temperature value, that is, comprising the retry tables T(10)-T(19), and select one of the retry tables T(10)-T(19) of the second retry type sequentially or randomly, for example, the retry table T(10); or alternatively, the controller 120 selects the retry table T(12) of the second retry type according to the specific index value, for example, 12.

Then, in step S440, re-reading the data stored on the target page by the controller 120 using the read parameter of the selected retry table. Assuming that the selected retry table is the retry table T(12), then re-reading the data stored on the target page by the controller 120 using the read parameter recorded by the retry table T(12), and returning to the step S420, determining by the controller 120 whether the data stored on the target page can be obtained.

In another embodiment, the step S430 further comprises: recording the index value of the selected retry table. For example, assuming that the controller 120 selects the retry table T(13) from the retry tables T(10) to T(19) of the second retry type, the index value of the retry table T(13) is recorded. In this way, after the controller 120 has obtained the data stored on the target page at this time by using the read parameter of the retry table T(13), when it is changed to reading the other target pages (or the other target pages of the other target blocks) and is executed to the step S430, the controller 120 will be able to select the retry table T(13) according to the recorded specific index value, or select the other retry table sequentially or randomly, and then executing the step S440 again.

In addition, in this embodiment, the method for re-reading page data can further comprise step S450. In the step S450, when the controller 120 is capable of obtaining the data stored on the target page by using the read parameter of the selected retry table, that is, when the determination result of the returned step S420 after going through the steps S430 to S440 is YES, then, re-ordering the index values of the retry tables in the selected retry type by the controller 120. For example, assuming that the controller 120 selects the retry table T(13) from the retry tables T(10) to T(19) of the second retry type, and when the controller 120 can obtain the data stored on the target page by using the read parameter of the retry table T(13), then setting the index value of the retry table T(13) as the highest priority sequence of the index values in the current second retry type. That is, the starting value is 10, and re-ordering the index values of the retry tables T(10)-T(12) before the retry table T(13). For example, the index values of the retry tables T(10)-T(12) are sequentially changed to 11 to 13. In this way, when it is changed to reading the other target pages (or the other target pages of the other target blocks) and is executed to the step S430, the retry table T(13) can be selected first.

In other words, in this embodiment, the controller 120 preferably re-reads the data stored on the target page by using the read parameter recorded by each of the retry tables T(10)-T(19) sequentially according to the index values (or the re-ordered index values) of the retry tables T(10)-T(19). Using FIG. 5A as an example, if the data stored on the target page still cannot be obtained by using the read parameter of the retry table T(10) (or the data errors of the read target page cannot be corrected), the controller 120 will continue to use the read parameter of the retry table with the index value the second smallest in the second retry type currently, that is, the retry table T(11), to re-read the data stored on the target page, and so on until the read parameter of each of the retry tables of the second retry type are used. If the controller 120 successfully uses the read parameter of the retry table T(15) to obtain the data stored on the target page, the controller 120 adjusts the index value of the retry table T(15) as the highest priority sequence of the index values of the retry tables T(10)-T(19). That is, the starting value is 10, and the index values of the other retry tables T(10)-T(19) are adjusted correspondingly, as shown in FIG. 5B.

Based on the above descriptions, it can be known that assuming the controller 120 needs to use the read parameter of the retry table T(15) to successfully obtain the data stored on the target page; in comparison with the conventional practices, which can only try one by one from the retry table T(0) to the retry table T(15) and it requires 16 times of reading on the target page; however, in this embodiment, it only needs to try one by one from the retry table T(10) to the retry table T(15) and it only requires 6 times of reading on the target page. Therefore, the present invention greatly reduces the time required to obtain the data stored on the target page, and also reduces the times of repetitive reading, and further reduces the read disturbance caused by frequent reading. In addition, because the threshold voltage distribution offset of all the pages of any one of the blocks are likely to be the same or similar under a same working environment, the index value of the most suitable retry table T(15) at this time in this embodiment is adjusted as the highest priority sequence of the index values of the retry tables T(10)-T(19), thereby effectively increasing the retry hit rates of the retry tables T(10)-T(19).

For example, when the controller 120 reads the other target pages (or the other target pages of the other target blocks) and is unable to obtain the stored data, and assuming that the environmental parameters at this time are respectively the current temperature value of 66 degrees, the programming time of 5 hours from the current time, the program/erase count of 100, and the read count of 2500. Therefore, the controller 120 can select one of the retry tables in the second retry type according to the temperature value again, and then, the controller 120 uses the read parameter of the most suitable retry table T(15) in the previous time with the index value the smallest in the second retry type currently to re-read the data stored on the target page at this time. However, if the data stored on the target page at this time still cannot be obtained by using the read parameter of the retry table T(15), the controller 120 will continue to use the read parameter of the retry table with the index value the second smallest in the second retry type, that is, the retry table T(10), to re-read the data stored on the target page at this time, and so on. If the controller 120 successfully uses the read parameter of the retry table T(16) to obtain the data stored on the target page at this time, the controller 120 adjusts the index value of the retry table T(16) as the highest priority sequence of the index values of the retry tables T(10)-T(19), that is, the starting value is 10, and the other index values of the retry tables T(10)-T(19) are correspondingly adjusted, as shown in FIG. 5C.

In addition, if the environmental parameters are respectively the current temperature value of 40 degrees, the programming time of 12 hours from the current time, the program/erase count of 1200, and the read count of 5000, and when the data stored on the target page at this time cannot be obtained. In the step S430, the controller 120 can select one of the retry tables T(30)-T(39) of the fourth retry type according to the program/erase count, for example, the retry table (30). In the step S440, the controller 120 uses the read parameter of the retry table (30) to re-read the data stored on the target page. Assuming that the data stored on the target page still cannot be successfully obtained by using the read parameter of the retry table (30), the step S420 to the step S440 are repeatedly executed until the data stored on the target page can be successfully obtained by using the read parameter of the retry table T(32). Then, the controller 120 adjusts the index value of the retry table T(32) as the highest priority sequence of the index values of the retry tables T(30)-T(39). That is, the starting value is 30, and the other index values of the other retry tables T(30)-T(39) are correspondingly adjusted, as shown in FIG. 5D.

Similarly, if the environmental parameters are respectively the current temperature value of 45 degrees, the programming time of 36 hours from the current time, the program/erase count of 600, and the read count of 25000, and when the data stored on the target page cannot be obtained. In the step S430, the controller 120 can select one of the retry tables T(20)-T(29) of the third retry type according to the programming time, for example, the retry table (20); or alternatively, select one of the retry tables T(40)-T(49) of the fifth retry type according to the read count, for example, the retry table T(40), and re-read the data stored on the target page according to the read parameters of the retry table T(20) or T(40). Since the details are also the same as described in the foregoing embodiments, they are not further described herein. In summary, because the present embodiment can use the read parameters of the different retry tables according to the environmental parameters and re-order the sequence of the retry tables according to the read results, the present invention can increase the retry hit rates and reduce the time required for re-reading the data of the target page.

In summary, if besides that the controller 120 can initially select one of the retry tables of one of the retry types according to the environmental parameters, the controller 120 can also select the other retry table of one of the retry types; or alternatively, when the controller 120 cannot select one of the retry tables of one of the retry types according to the environmental parameters, for example, the temperature value is reduced to 45 degrees, at this time, the controller 120 can also select one of the retry tables according to the index values. Then, executing the step S440 again.

As a conclusion from the above, the method for re-reading page data provided in the embodiments of the present invention can select from a plurality of retry tables of a suitable retry type to re-read the target page according to the environmental parameters related to reading the target page alone, thereby reducing a number of times of repetitively reading the target page and preventing read disturbance caused by frequent reading. Additionally, since the method for re-reading page data can also arrange the most suitable retry table to the highest priority sequence, the present invention can achieve increasing relatively the retry hit rate.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A method for re-reading page data executed in a data storage device, the data storage device comprising a non-volatile memory and a controller, the non-volatile memory comprising a plurality of blocks and each of the blocks comprising a plurality of pages, the method for re-reading page data comprising steps of:

reading the data stored on a target page of a target block by the controller, wherein the target block is one of the blocks, and the target page is correspondingly one of the pages of the target block;

determining by the controller whether the data stored on the target page can be obtained;

if the data stored on the target page cannot be obtained, selecting one of a plurality of retry types by the controller according to at least one environmental parameter, and selecting a retry table from a plurality of retry tables of the selected retry type, wherein each of the retry tables further comprises an index value and records at least one read parameter; and re-reading the data stored on the target page by the controller using the read parameter of the selected retry table, and returning to the step of determining by the controller whether the data stored on the target page can be obtained.

2. The method for re-reading page data according to claim 1, further comprising:

if the data stored on the target page can be obtained, ending the method for re-reading page data by the controller.

3. The method for re-reading page data according to claim 2, further comprising:

when the controller being capable of obtaining the data stored on the target page by using the read parameter of the selected retry table, re-ordering the index values of the retry tables in the selected retry type by the controller.

4. The method for re-reading page data according to claim 2, wherein the step of selecting a retry table from the retry tables of the selected retry type further comprises recording the index value of the selected retry table.

5. The method for re-reading page data according to claim 1, wherein in the step of selecting a retry table from the retry tables of the selected retry type, the controller selects one of the retry tables sequentially according to the index values of the retry tables, or the controller selects one of the retry tables randomly.

6. The method for re-reading page data according to claim 4, wherein in the step of selecting a retry table from the retry tables of the selected retry type, the controller selects one of the retry tables according to the recorded index value.

7. The method for re-reading page data according to claim 1, wherein the target block or the target page is specified by a data read command, or determined according to the data read command and a logical address to physical address mapping table, wherein the data read command is sent from a host to the data storage device, and the logical address to physical address mapping able is stored in the data storage device, and temporarily stored in a volatile memory of the data storage device or the host.

8. The method for re-reading page data according to claim 1, wherein in the step of reading the data stored on the target page by the controller, the controller corrects data errors of the read target page by using an error correction code, and when determining that the data stored on the target page cannot be obtained, it indicates that the number of bits of the data errors exceeds an upper limit the error correction code can correct.

9. The method for re-reading page data according to claim 1, wherein the data storage device classifies each of the retry tables into one of the retry types respectively by using the controller, and the at least one environmental parameter refers to a temperature value, a programming time, a program/erase count or/and a read count.

* * * * *